United States Patent
Sakai

[11] Patent Number: 6,099,581
[45] Date of Patent: Aug. 8, 2000

[54] LAYOUT DATABASE FOR A COMPUTER AIDED DESIGN SYSTEM

[75] Inventor: Itaru Sakai, Kasugai, Japan

[73] Assignee: Fujitsu Limited, Kawasaki, Japan

[21] Appl. No.: 08/829,180

[22] Filed: Mar. 31, 1997

[30] Foreign Application Priority Data

Sep. 10, 1996 [JP] Japan .................................. 8-239103

[51] Int. Cl.[7] .................................................. G06F 17/50
[52] U.S. Cl. .................................... 716/11; 716/10; 716/9
[58] Field of Search ................................... 364/488, 489, 364/490, 491; 395/500.09, 500.1, 500.11, 500.12; 716/11, 10, 9

[56] References Cited

U.S. PATENT DOCUMENTS

| | | | |
|---|---|---|---|
| 4,823,278 | 4/1989 | Kikuchi et al. .............................. | 716/6 |
| 5,353,235 | 10/1994 | Do et al. ..................................... | 716/14 |
| 5,461,576 | 10/1995 | Tsay et al. ................................... | 716/6 |
| 5,581,474 | 12/1996 | Bamji et al. ................................. | 716/2 |
| 5,610,832 | 3/1997 | Wikle et al. ............................... | 364/491 |
| 5,629,860 | 5/1997 | Jones et al. ................................. | 716/6 |
| 5,636,132 | 6/1997 | Kamdar ....................................... | 716/2 |
| 5,638,294 | 6/1997 | Sasada ......................................... | 716/5 |
| 5,654,898 | 8/1997 | Roetcisoender et al. .................... | 716/9 |
| 5,689,432 | 11/1997 | Blaauw et al. .............................. | 716/18 |
| 5,724,250 | 3/1998 | Kerzman et al. ............................ | 716/3 |
| 5,745,124 | 4/1998 | Parks et al. .............................. | 345/441 |
| 5,903,469 | 5/1999 | Ho ................................................ | 716/5 |

*Primary Examiner*—Paul R. Lintz
*Assistant Examiner*—Vuthe Siek
*Attorney, Agent, or Firm*—Staas & Halsey LLP

[57] ABSTRACT

In a computer aided design system, a method of performing a layout process of an integrated circuit uses predetermined logic design and predetermined connection data. The connection data is changeable by an operator. The method includes the steps of generating new layout data using new connection data when the connection data is changed by the operator, replacing the layout data stored in the database with the new layout data, extracting parasitic elements from the new layout data to generate new parasitic element data; replacing the parasitic element data stored in the database with the new parasitic element data, computing signal delay times of the new parasitic elements to generate new delay time data; replacing the delay time data stored in the database with the new delay time data; and repeating above steps each time the connection data is changed by the operator.

4 Claims, 13 Drawing Sheets

```
Circuit Name : ABC ;
  Input pin  : A ;
  Output pin : B, C  ;
  N1: A, I1.a ;
  N2: I1.x, I2.a, I3.a ;
  N3: I2.x, B ;
  N4: I3.x, C ;
End of ABC;
```
~1

LAYOUT DATABASE FOR A COMPUTER AIDED DESIGN SYSTEM

BACKGROUND OF THE INVENTION

1. Field of the Invention

The present invention relates generally to a method and apparatus for designing the layout of a semiconductor circuit device. More particularly, this invention relates to a layout method and apparatus which shorten the time needed to design an LSI circuit pattern.

2. Description of the Related Art

To shorten the development period for large scale and highly integrated circuits, such as LSI circuits, it is essential to shorten the time required for designing the layout of such LSIs.

FIG. 1 presents a flowchart for a conventional layout process in the design of a semiconductor integrated circuit devices such as LSI and VLSI. In step S1, circuit design (logic design) is executed based on specifications to generate circuit connection data, or a net list 1. "The connection data" is defined as a compilation of information descriptive of primitives of a logic circuit, which includes a cell in a circuit and its interconnection elements. In step S2, the layout design of a mask pattern is performed using the circuit connection data 1 to generate layout data 2.

In step S3, parasitic elements included in an interconnection pattern are extracted based on the layout data 2 to generate parasitic element data 3. In step S4, a signal delay time originating from the parasitic elements is computed using the parasitic element data 3 to generate delay time data 4. In step S5, circuit logic simulation is performed using the data 1 to 4 to examine the signal delay time originating from the parasitic elements or to perform back annotation.

Steps S3 and S4 are batch processes for all the interconnection patterns included in the layout data 2. An increase in the number of interconnection patterns or increasing the integration scale of LSIs, lengthens the processing times in steps S3 and S4. That is, the time from the beginning of the circuit design process to the end of circuit logic simulation becomes longer.

When the circuit logic simulation shows that a desired operation cannot be performed due to a difference between signal propagation times, it is necessary to execute a circuit alteration routine to insert a buffer or layout correction to change the paths of the interconnection pattern in step S1 or S2. This layout correction necessitates repeating the processes in steps S3 and S4 and the circuit logic simulation. In other words, if layout correction is performed, the extraction of parasitic elements and the computation of the delay time should be executed. This increases the designing time.

To shorten the LSI design period, as shown in FIG. 2, a method for reducing the number of returns from the layout design to the circuit design has been proposed. In step S6, restriction data 5 is generated. This restriction data 5 includes data representing an allowable delay time in association with a plurality of critical signal lines and data representing allowable lengths of the critical signal lines based on the delay time. In step S7, using the circuit connection data 1, a plurality of cells are automatically positioned in such a way as to meet the restriction data 5 to generate positioning data 6. In step S8, automatic interconnection is performed based on the positioning data 6 to generate layout data 2.

Even if the layout data 2 satisfies the restriction data 5 generated in steps S7 and S8, the LSI as a whole may still have some problems depending on, for example, the states of the interconnection paths. To cope with such a problems, an operator executes interactive layout correction in step S9 to change the positions of the cells and the routing of the interconnections. As a result, new layout data 2a is generated. Based on this new layout data 2a, the parasitic element data 3 and the delay time 4 are generated as shown in FIG. 1, step S3. Then, circuit logic simulation is performed in step S5.

The restriction data 5 defines restrictions for the automatic positioning of the elements in the automatic positioning/interconnecting process. The restriction data 5 is not however associated with the layout data 2 and 2a. It is not therefore possible to guarantee that the new layout data 2a meets the conditions of the restriction data 5. To check if the restriction conditions are met, processes in steps S3 to S5 are needed. If the results of the circuit logic simulation, step S5, show that the restriction conditions are not met and there is a signal timing problem, the flow should return to step S9 to allow the operator to correct the layout. This requires a significant time from the start of circuit design to the end thereof, thus resulting in a longer period until the completion of LSI development.

SUMMARY OF THE INVENTION

Briefly, the present invention relates to a layout method and apparatus which shorten the LSI design period. The present invention can be implemented in numerous ways including as an apparatus and a method.

A first embodiment of the invention pertains to a method of performing a layout process of an integrated circuit using predetermined logic design and predetermined connection data in a computer aided design system. The connection data is changeable by an operator. The method includes the steps of: (a) generating layout data using the connection data; (b) storing the layout data in a database comprising a predetermined data structure; (c) extracting parasitic elements from the layout data to generate parasitic element data; (d) storing the parasitic elements in the database; (e) computing signal delay times of the parasitic elements to generate delay time data; (f) storing the computed signal delay times in the database; (g) generating new layout data using new connection data when the connection data is changed by the operator; (h) replacing the layout data stored in the database with the new layout data; (i) extracting parasitic elements from the new layout data to generate new parasitic element data; (j) replacing the parasitic element data stored in the database with the new parasitic element data; (k) computing signal delay times of the new parasitic elements to generate new delay time data; (l) replacing the delay time data stored in the database with the new delay time data; and (m) repeating steps (g) through (l) each time the connection data is changed by the operator.

The method of the first embodiment may also includes the steps of: (n) comparing the signal delay times to respective predetermined boundary values of the connection data; (o) interactively correcting the layout data if any of critical nets are outside of their respective bounds; (p) updating the layout data stored in the database with the updated layout data; and (q) repeating steps (g) through (p) until no signal delay times are outside of their respective predetermined boundary values.

A second embodiment of the invention pertains to an apparatus for designing a layout of an integrated circuit using predetermined logic design and predetermined connection data. The connection data is changeable by an operator. The apparatus includes: an input device operable by the operator to input and change the connection data; a memory having a database comprising a predetermined data structure; and a processing unit coupled to the input unit and the memory. The processing unit operates to: (a) generate layout data using the connection data; (b) store the layout data in the database; (c) extract parasitic elements from the layout data to generate parasitic element data; (d) store the parasitic elements in the database, (e) compute signal delay times of the parasitic elements to generate delay time data; (f) store the computed signal delay times in the database; (g) generate new layout data using new connection data when the connection data is changed by the operator using the input device; (h) replace the layout data stored in the database with the new layout data; (i) extract parasitic elements from the new layout data to generate new parasitic element data; (j) replace the parasitic element data stored in the database with the new parasitic element data; (k) compute signal delay times of the new parasitic elements to generate new delay time data; (l) replace the delay time data stored in the database with the new delay time data, and (m) repeat the operations (g) through (l) each time the connection data is changed by the operator.

In the apparatus of the second embodiment, the processing unit may operates to: (n) compare the signal delay times to respective predetermined boundary values of the connection data; (o) interactively correct the layout data if any of critical nets are outside of their respective bounds; (p) update the layout data stored in the database with the updated layout data, and (q) repeat the operations (g) through (p) until no signal delay times are outside of their respective predetermined boundary values.

A third embodiment of the invention pertains to a data structure for storing integrated circuit layout data. The integrated circuit includes a plurality of interconnected circuit elements. The structure includes: a net data table comprising circuit element connection information; a pattern data table comprising circuit element pattern information; a parasitic element data table comprising parasitic element data extracted from the connection information and the pattern information; a delay time data table comprising net delay times computed with the connection information, the pattern information and the parasitic element information; first association data for associating the net data table with the pattern data table; second association data for associating the pattern data table with the parasitic element data table; and third association data for associating the parasitic element data table with the delay time data table.

The data structure of the third embodiment may also includes fourth association data for associating the delay time data table with the net data table.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings, in which.

DETAILED DESCRIPTION OF THE PREFERRED EMBODIMENTS

Figure 3:
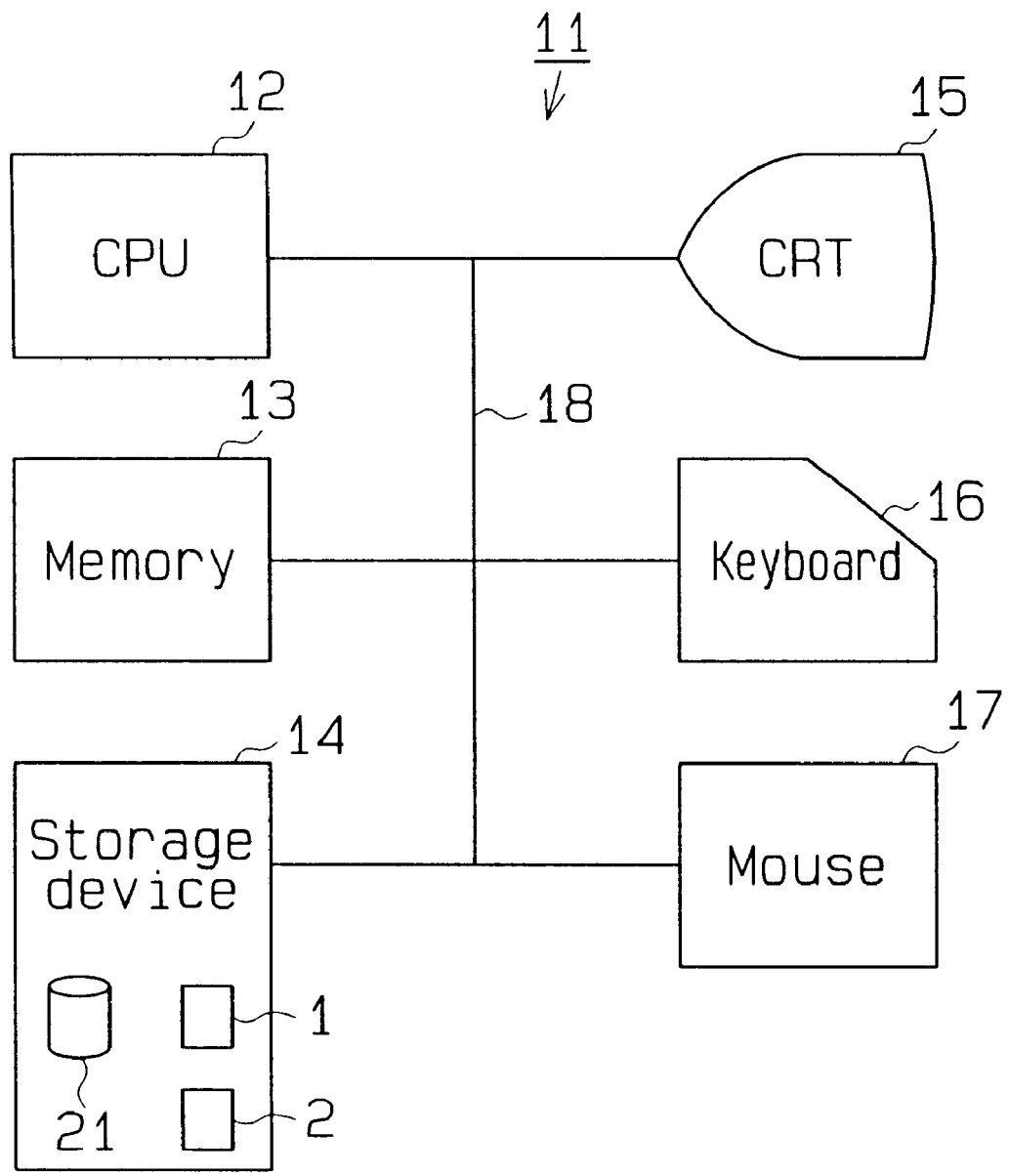
FIG. 3 is a schematic block diagram showing a layout design apparatus embodying the present invention.
Figure 4:
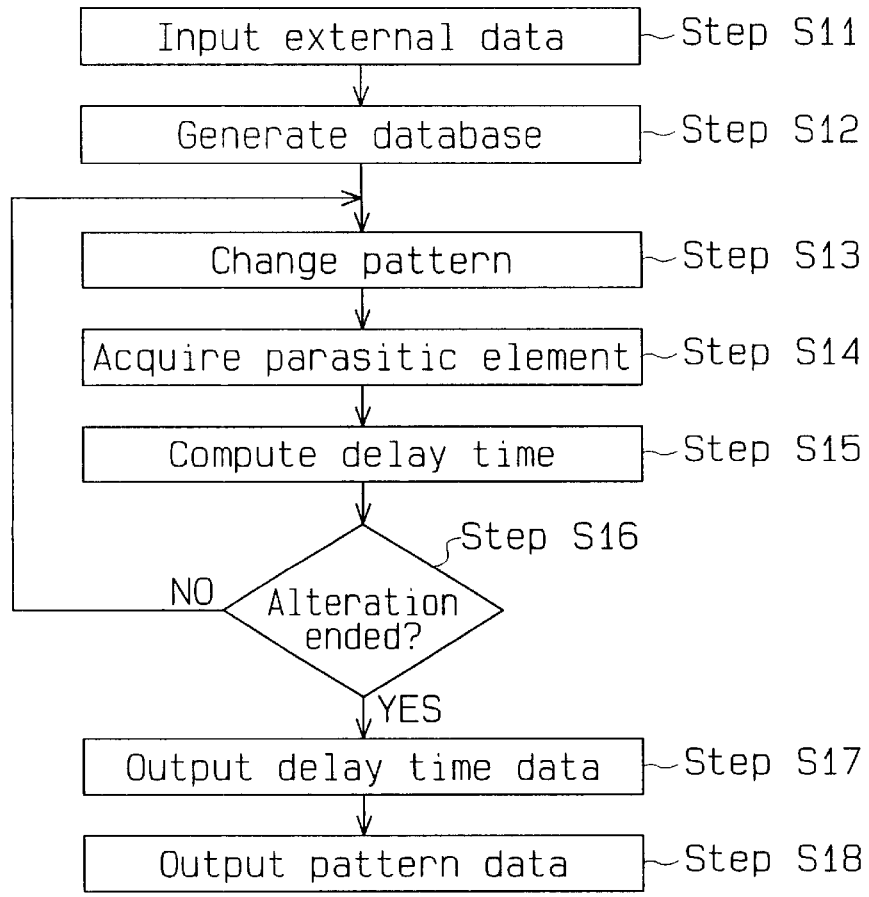
FIG. 4 is a flowchart illustrating a layout process according to the first embodiment of this invention.

A layout design apparatus according to the first embodiment of this invention will now be described with reference to the accompanying drawings. As shown in FIG. 3, a layout design apparatus 11 comprises a computer aided design (CAD) apparatus which includes a central processing unit (CPU) 12, a memory 13, a storage device 14 such as a magnetic disk drive, a CRT 15, a keyboard 16 and a mouse 17. Those individual units are mutually connected by a system bus 18, in a conventional manner as is known by those of ordinary skill in the art.

Stored in the memory 13 is predetermined program data which is used in the processes executed by the CPU 12. The memory 13 receives and stores circuit connection data 1 and layout data 2, shown in FIG. 1, supplied from the storage device 14.

The program data is used to correct the layout data 2. The circuit connection data 1 is generated in the circuit design process in step Si shown in FIG. 1, and the layout data 2 is generated in the layout design process in step S2. The circuit connection data 1 and layout data 2 are temporarily stored in a predetermined memory area on a disk (not shown) in the storage device 14, and are transferred to the memory 13 as required.

In accordance with the program data, the CPU 12 operates to read the circuit connection data 1 and layout data 2 from the memory 13 to generate a database 21 and temporarily store the database 21 in the memory 13. When the layout data 2 is corrected by an operator, the CPU 12 updates the database 21. Upon completion of the program, the CPU 12 operates to store the corrected layout data 2 and database 21 in the predetermined memory area on the disk in the storage device 14.

Figure 6:
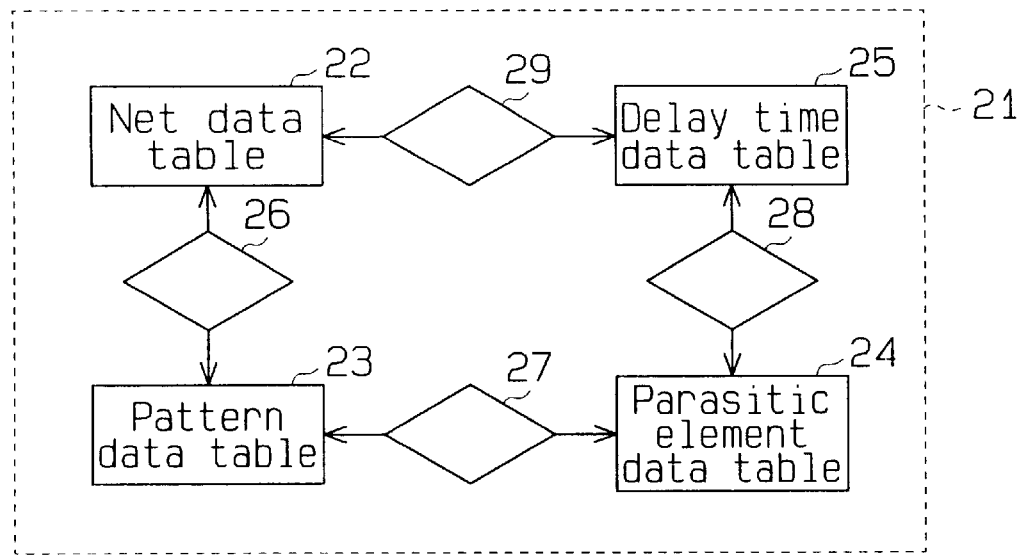
FIG. 6 schematically shows the structure of a database to be stored in a memory included in the layout design apparatus of FIG. 1.

As shown in FIG. 6, the database 21 includes a net data table (net DT) 22, a pattern data table (pattern DT) 23, a parasitic element data table (parasitic element DT) 24 and a delay time data table (delay time DT) 25. The database 21 further includes association data 26 for associating the net DT 22 with the pattern DT 23, association data 27 for associating the pattern DT 23 with the parasitic element DT 24, association data 28 for associating the parasitic element DT 24 with the delay tire DT 25, and association data 29 for associating the delay time DT 25 with the net DT 22.

The circuit connection data 1 is stored as circuit connection information in the net DT 22, and the layout data 2 is stored as circuit pattern information in the pattern DT 23. The parasitic element data, which has been extracted based on such information, is stored as parasitic element information in the parasitic element DT 24, and the delay time data of each net, which has been computed using the parasitic element data, is stored as delay time information in the delay time DT 25. When layout alteration, such as a change in cell arrangement or a change in the paths of the interconnection pattern is performed, the circuit pattern information is changed and the pattern DT 23 is updated every time such alteration is performed. Further, reextraction of parasitic elements and recomputation of the delay time are executed to update the parasitic element information and delay time information, and the parasitic element DT 24 and the delay time DT 25 are updated accordingly. According to this embodiment, therefore, after the layout design is completed, the extraction of parasitic elements and the computation of the delay time need not be performed by batch processes. This feature effectively shortens the design time.

The information which are respectively stored in the net DT 22, the pattern DT 23, the parasitic element DT 24 and the delay time DT 25, are associated with one another by the association data 26–29. This facilitates the acquisition of information in one DT which is associated with information in another DT.

The first embodiment of this invention will now be described more specifically. The net DT 22 where the circuit connection information 1 is stored is defined in a predetermined memory area in the memory 13. This circuit connection information includes the name of a net and information about a terminal to be connected to that net. The pattern DT 23 where the circuit pattern information is stored is defined in a predetermined memory area in the memory 13. The circuit pattern information includes information about the arrangement of the cells, the position of each interconnection pattern and a layer.

The parasitic element DT 24 where the parasitic element information is stored is defined in a predetermined memory area in the memory 13. The delay time DT 25 where the delay time information of each net is stored is defined in a predetermined memory area in the memory 13.

The association data 26 indicates the association of circuit connection information with circuit pattern information, and includes storage addresses of both information. The storage address in the net DT 22 for circuit connection information is stored in the pattern DT 23 as a storage address for the associated circuit pattern information. Further, the storage address in the pattern DT 23 for circuit pattern information is stored as a storage address for the associated circuit connection information in the net DT 22. Accordingly, the circuit pattern information associated with specific circuit connection information is acquired from the pattern DT 23 in accordance with the storage address in the net DT 22. The circuit connection information associated with specific circuit pattern information is acquired from the net DT 22 in accordance with the storage address in the pattern DT 23. In other words, circuit connection information and circuit pattern information are associated with each other by the exchange of their storage addresses and are retained in such a way that they are searchable by the storage addresses.

The association data 27 indicates the association of circuit pattern information with parasitic element information, and includes storage addresses of both information. The storage address in the pattern DT 23 for circuit pattern information is stored in the parasitic element DT 24 as a storage address for the associated parasitic element information. Further, the storage address in the parasitic element DT 24 for parasitic element information is stored as a storage address for the associated circuit pattern information in the pattern DT 23. Accordingly, the parasitic element information associated with specific circuit pattern information is acquired from the parasitic element DT 24 in accordance with the storage address in the pattern DT 23. The circuit pattern information associated with specific parasitic element information is acquired from the pattern DT 23 in accordance with the storage address in the parasitic element DT 24. Tn other words, circuit pattern information and parasitic element information are associated with each other by the exchange of their storage addresses and are retained in such a way that they are searchable by the storage addresses.

The association data 28 indicates the association of parasitic element information with delay time information, and includes storage addresses of both information. The storage address in the parasitic element DT 24 for parasitic element information is stored in the delay time DT 25 as a storage address for the associated delay time information. Further, the storage address in the delay time DT 25 for delay time information is stored as a storage address for the associated parasitic element information in the parasitic element DT 24. Accordingly, the delay time information associated with specific parasitic element information is acquired from the delay time DT 25 in accordance with the storage address in the parasitic element DT 24. The parasitic element information associated with specific delay time information is acquired from the parasitic element DT 24 in accordance with the storage address in the delay time DT 25. That is, parasitic element information and delay time information are associated with. each other by the exchange of their storage addresses and are retained in such a manner that they are searchable by the storage addresses.

The association data 29 indicates the association of delay time information with circuit connection information, and includes storage addresses of both information. The storage address in the delay time DT 25 for delay time information is stored in the net DT 22 as a storage address for the associated circuit connection information. Further, the storage address in the net DT 22 for circuit connection information is stored as a storage address for the associated delay time information in the delay time DT 25. Accordingly, the circuit connection information associated with specific delay time information is acquired from the net DT 22 in accordance with the storage address in the delay time DT 25. The delay time information associated with specific circuit connection information is acquired from the delay time DT 25 in accordance with the storage address in the net DT 22. That is, delay time information and circuit connection information are associated with each other by the exchange of their storage addresses and are retained in such a manner that they are searchable by the storage addresses.

In addition to those association data 26–29, association data which indicates the association between circuit connection information and parasitic element information may be used.

The CRT 15 shown in FIG. 3 is a graphic display capable of displaying the layout data 2 that has been read by the CPU 12, thus allowing the operator to correct the layout data 2 displayed on the CRT 15 in an interactive manner. That is, the operator operates the keyboard 16 and the mouse 17 or other input devices, to instruct alteration of the cell arrangement or the paths for the interconnection pattern while viewing the layout data 2 displayed on the screen.

The CPU 12 operates to change circuit pattern information in the pattern DT 23 in accordance with an alteration instruction by the operator. Based on the changed circuit pattern information, the CPU 12 extracts parasitic elements of the interconnection patterns and alters the parasitic element information which is associated with the changed circuit pattern information. The CPU 12 computes the delay time for each interconnection pattern based on the altered parasitic element information and changes the delay time information associated with the altered parasitic element information. As the layout of the interconnection patterns or positional information is changed, the associated parasitic element information and delay time information are automatically calculated and altered or updated.

Figure 7:
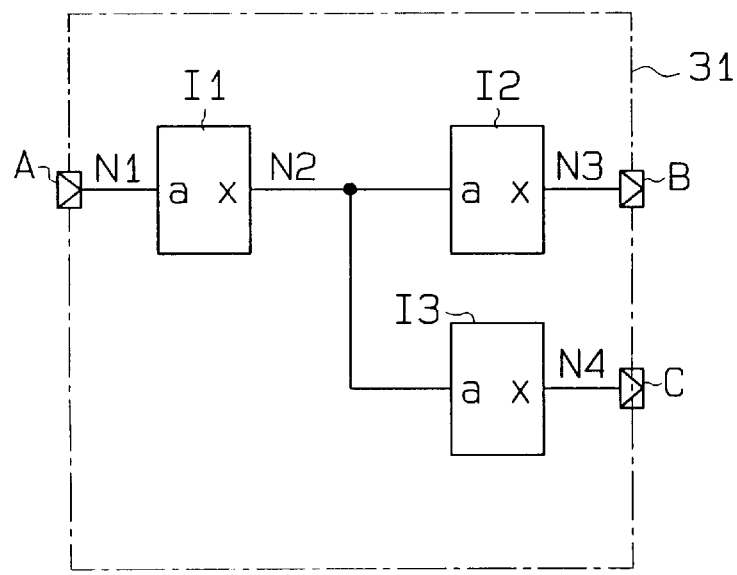
FIG. 7 is a circuit diagram exemplifying a logic circuit to be designed.

The operation of the above-described layout design apparatus 11 will now be discussed. In the following description, a semiconductor device 31 shown in FIG. 7 will be used as an example. The semiconductor device 31 includes external terminals A, B and C and logic elements I1, I2 and I3. In the following example, the individual logic elements I1–I3 are inverters each having an input terminal a and an output terminal x, however, as will be understood by those of ordinary skill in the art, other logic elements could be used. The external terminal A and an input terminal a of the logic element I1 are connected together by an interconnection which is defined as a net name "NI". An output terminal x of the logic element I1 and input terminals a of the logic elements I2 and I3 are mutually connected by an interconnection which is defined as a net name "N2". An output terminal x of the logic element I2 and the external terminal B are connected together by the interconnection which is defined as a net name "N3". An output terminal x of the logic element I3 and the external terminal C are connected together by the interconnection which is defined as a net name "N4". Further, as shown in FIG. 9, the logic elements I1–I3 of the semiconductor device 31 are laid out on plural rows of cells (indicated by a dash and dotted line).

Figure 1:
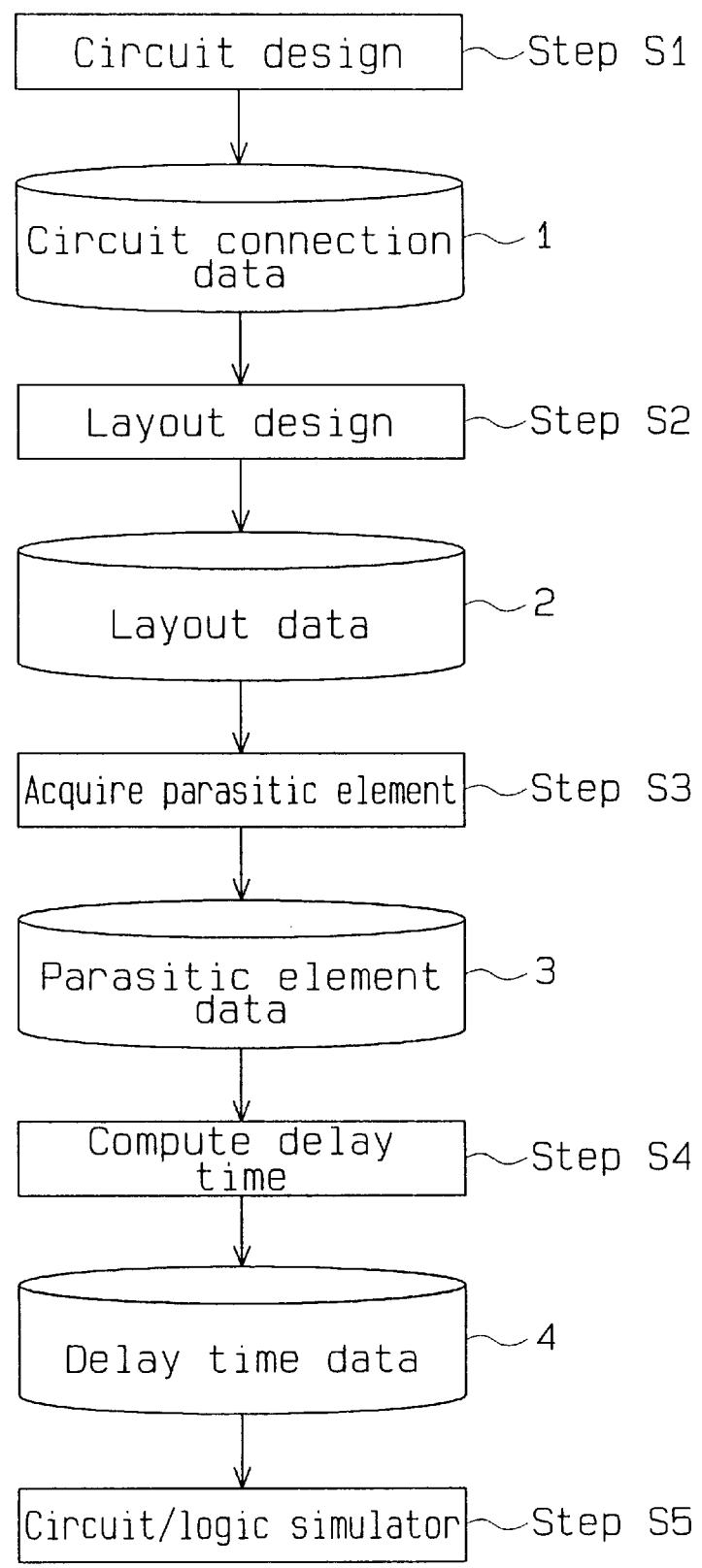
FIG. 1 is a flowchart illustrating a first prior art layout process in designing a large scale semiconductor integrated circuit device.
Figure 2:
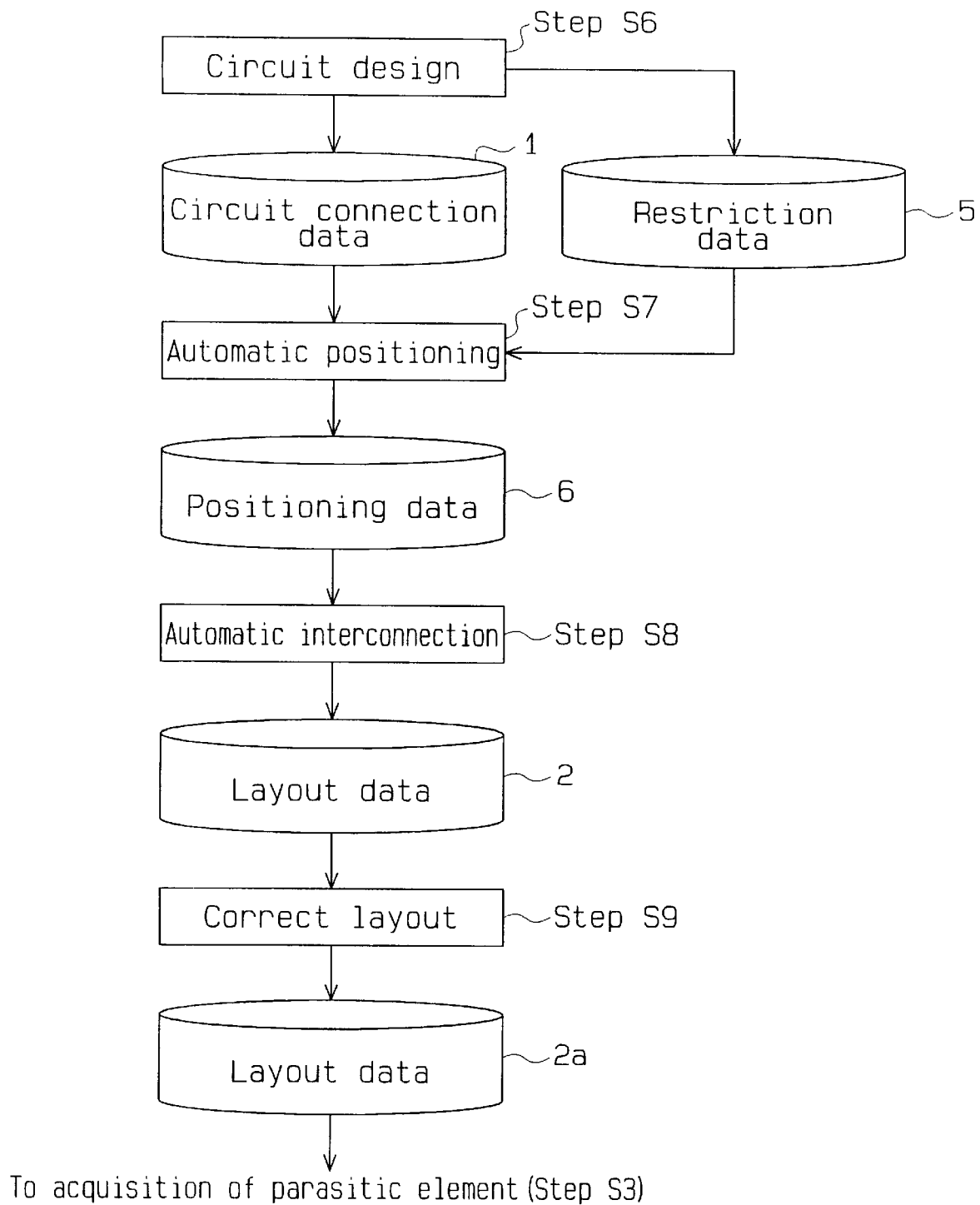
FIG. 2 is a flowchart illustrating a part of a second prior art layout process in designing a large scale semiconductor integrated circuit device.

As shown in FIG. 2, the CPU 12 receives the circuit connection data 1 and the layout data 2, both generated by the designing process illustrated in FIG. 1, as external data in step S11. The circuit connection data 1 is stored as circuit connection information in the net DT 22 of the database 21, and the layout data 2 is stored as circuit pattern information in the pattern DT 23.

Figures 8, 9:
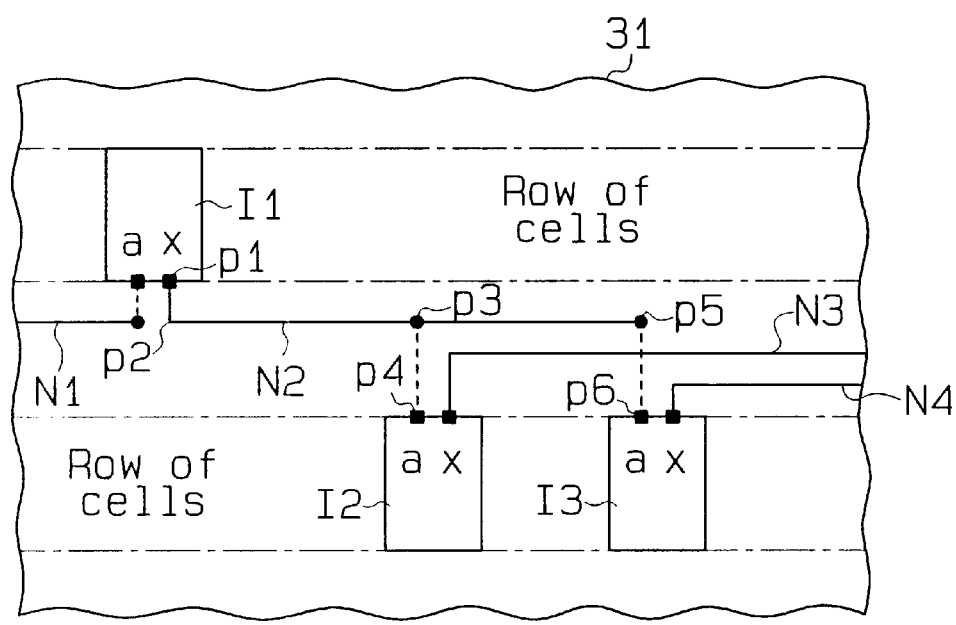
FIG. 8 shows circuit connection data of the logic circuit in FIG. 7.
FIG. 9 depicts a layout pattern of the logic circuit.
Figure 10:
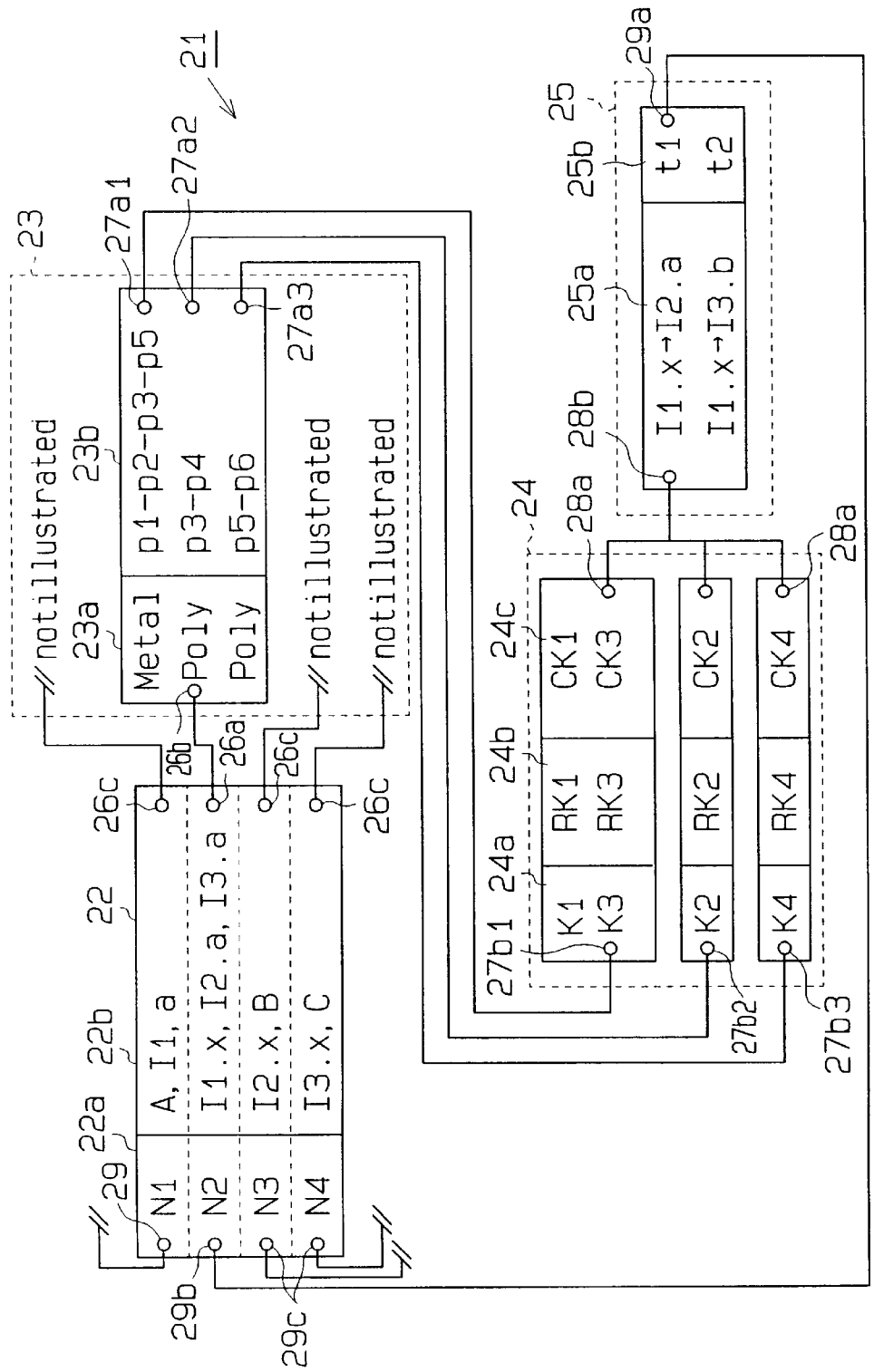
FIG. 10 is a detailed illustration of the structure of a database generated by the layout process according to the first embodiment of the present invention.

More specifically, the circuit connection data 1 includes information in which the relation of the connection among individual interconnections N1–N4 and the terminals, as shown in FIG. 8. In the figure, "I1.a" indicates the input terminal a of the logic element I1, and "I1.x" indicates the output terminal x of the logic element I1. Likewise, "I2.a" indicates the input terminal a of the logic element I2, and "I2.x" indicates the output terminal x of the logic element I2, while "I3.a" indicates the input terminal a of the logic element I3, and "I3.x" indicates the output terminal x of the logic element I3. As shown in FIG. 10, therefore, data of the interconnections N1–N4 are stored in an area 22a, and connection data of the terminals connected to those nets is stored in an area 22b.

The layout data 2 includes coordinate data which defines the individual logic elements I1–I3 and the individual interconnections, and data of layers on which the interconnections are formed. For example, the interconnection N2 is defined by the coordinate data of positions p1 to p6. In FIG. 9, the interconnection which is connected by the solid lines in the path of p1-p2-p3-p5 is formed on a metal layer. Further, the interconnections which are connected by the broken lines in the path of p3-p4 and the path of p5-p6 are formed on a polysilicon layer. As shown in FIG. 10, therefore, the interconnection layer data of the circuit pattern is stored in an area 23a, and the coordinate data of the circuit pattern is stored in an area 23b. Information associated with the interconnection N2 alone is shown in FIG. 10, and information about the other interconnections N1, N3 and N4 and layout information of the individual logic elements I1–I3 are omitted.

Process of Generating Database

Figure 5:
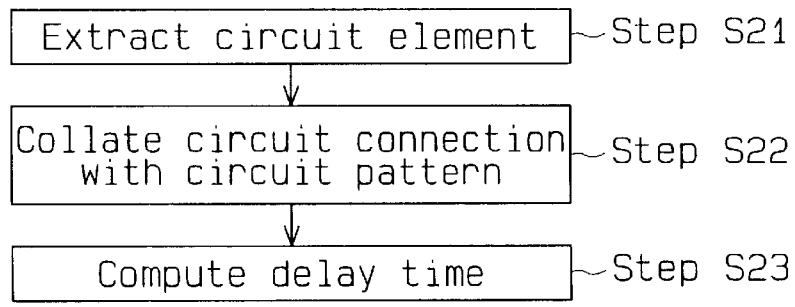
FIG. 5 is a flowchart illustrating a database generating process in the flowchart in FIG. 4.

In step S12, the CPU 12 generates the database 21 in accordance with the flowchart for the database generating process illustrated in FIG. 5. In step S21 in FIG. 5, the CPU 12 extracts a parasitic element including a parasitic resistor and a parasitic capacitor based on circuit pattern information stored in the pattern DT 23. The parasitic resistor is an equipotential resistor, and the parasitic capacitor is the capacitor of the interconnection in question. The resistance of the parasitic resistor is obtained by multiplying the resistance per unit length that has been set in accordance with the characteristic of the interconnection layer on which the interconnection pattern is formed, by the length of the interconnection between terminals. The capacitance of the parasitic capacitor is obtained by multiplying the capacitance per unit length of the interconnection by the length of the interconnection. The information on the extracted parasitic element is stored in an area 24a in the parasitic element DT 24 shown in FIG. 10. The information on the extracted parasitic resistor is stored in an area 24b and the information on the parasitic capacitor is stored in an area 24c.

For instance, a part of the interconnection N2 in FIG. 9 is formed on the same metal (aluminum) interconnection layer between the coordinates p1-p2-p3, and thus equipotential. Therefore, the CPU 12 extracts the interconnection among the coordinates p1, p2 and p3 as a parasitic element K1, which includes a parasitic resistor RK1 and a parasitic capacitor CK1. Likewise, the interconnection that is formed on the same metal interconnection layer between the coordinates p3 and p4 is extracted as a parasitic element K3, which includes a parasitic resistor RK3 and a parasitic capacitor CK3. The interconnection that is formed on the same polysilicon interconnection layer between the coordinates p3 and p5 is extracted as a parasitic element K2, which includes a parasitic resistor RK2 and a parasitic capacitor CK2. The interconnection that is formed on the same polysilicon interconnection layer between the coordinates p5 and p6 is extracted as a parasitic element K4, which includes a parasitic resistor RK4 and a parasitic capacitor CK4. The parasitic elements K1–K4, the parasitic resistors RK1–RK4 and the parasitic capacitors CK1–CK4 are stored in the parasitic element DT 24, as shown in FIG. 10.

Figure 11:
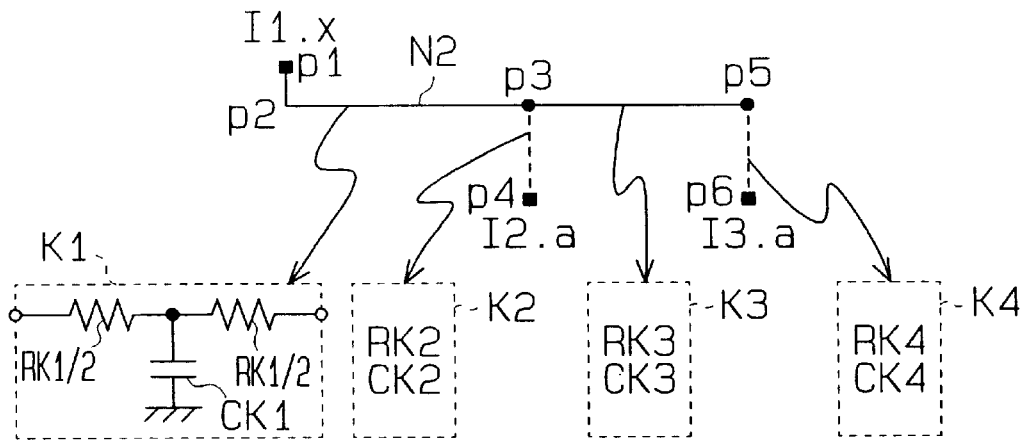
FIG. 11 is a diagram showing parasitic elements included in an interconnection pattern.

To associate the pattern DT 23 and the parasitic element DT 24 with each other, the CPU 12 stores storage addresses 27a1 to 27a3 in the parasitic element DT 24 in the pattern DT 23, and storage addresses 27b1 to 27b3 in the pattern DT 23 in the parasitic element DT 24. As shown in FIG. 11, for example, the metal interconnection between the coordinates p1 and p5 is associated with the parasitic elements K1 and K3. Therefore, the storage address 27a1 for the parasitic elements K1 and K3 is stored in the area 23b in the pattern DT 23 where the information on the metal interconnection among the coordinates p1, p2, p3 and p5 is stored. The storage address 27b1 for the metal interconnection is stored in the area 24a in the parasitic element DT 24 where the information on the parasitic elements K1 and K3 is stored.

The storage address 27a2 for the parasitic element K2 is stored in the area 23b where the information on the polysilicon interconnection between the coordinates p3 and p4 is stored. The storage address 27b2 for the polysilicon interconnection is stored in the area 24a where the information on the parasitic element K2 is stored. The storage address 27a3 for the parasitic element K4 is stored in the area 23b where the information on the polysilicon interconnection between the coordinates p5 and p6 is stored. The storage address 27b3 for the polysilicon interconnection is stored in the area 24a where the information on the parasitic element K4 is stored.

In the next step S22, the CPU 12 stores, for example, a storage address 26a for data of the interconnection layer for the interconnection N2 in the area 22b in the net DT 22 where the circuit connection information on the interconnection N2 is stored. On the other hand, a storage address 26b for circuit connection information on the interconnection N2 is stored in the area 23a in the pattern DT 23 where the interconnection layer data is stored. Likewise, storage addresses 26c for interconnection layer data of the individual interconnections, which are not illustrated in the figure, are stored in the respective areas 22b where the circuit connection information on the other interconnections N1, N3 and N4 are stored. Further, storage addresses for the circuit connection information on the other interconnections N1, N3 and N4 are stored in the respective areas (not shown) where the associated interconnection layer data are stored.

As apparent from the above, to associate circuit connection information and circuit pattern information with each other, the CPU 12 collates the circuit connection information stored in the net DT 22 with the circuit pattern information stored in the pattern DT 23. This association can be accomplished by the conventional technique of extracting circuit information from a layout and circuit collation technique. Thereafter, the CPU 12 exchanges the storage address for DT 22 and DT 23 with each other to associate the circuit connection information and the circuit pattern information with each other.

Next, the CPU 12 computes delay times between terminals using the parasitic element information stored in the parasitic element DT 24 in step S23. The inter-terminal information is stored in an area 25a in the delay time DT 25, and the delay time information is stored in an area 25b in the delay time DT 25.

In the computation of the delay times, each of the extracted parasitic elements K1–K4 are treated as an equivalent circuit of a "T model" which comprises the associated one of the parasitic resistor RK1–RK4 and the associated one of the parasitic capacitors CK1–CK4. Each of the parasitic elements K1–K4 may be treated as an equivalent circuit of another model such as "π model" in addition to the "T model". As shown in FIG. 11, the terminals to be connected to the interconnection N2 are "I1.x", "I2.a" and "I3.a". In this case, delay times for a pair of the output terminal "I1.x" and the input terminal "I2.a" and a pair of the output terminal "I1.x" and the input terminal "I3.a" are computed.

Figure 12:
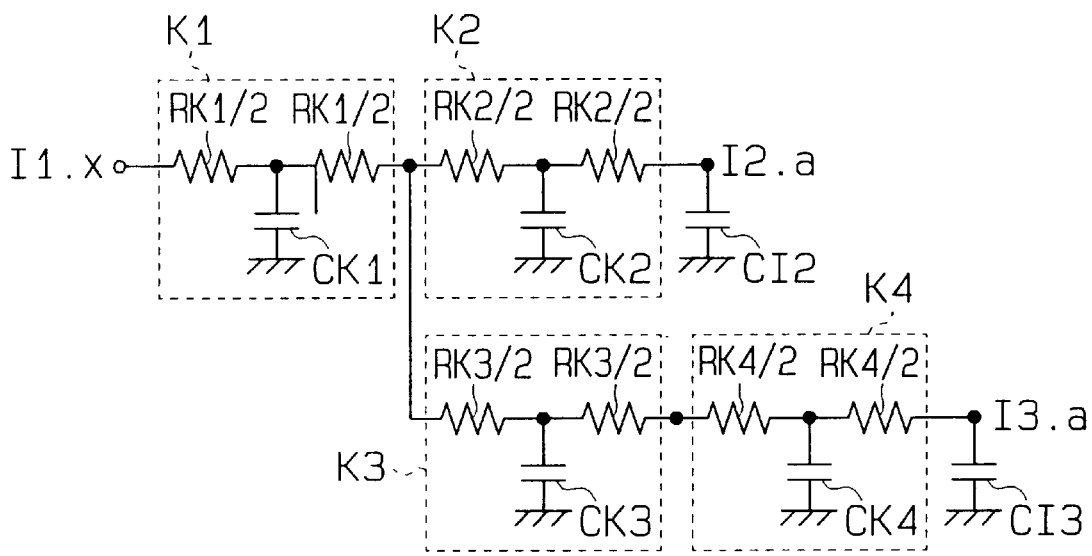
FIG. 12 is an equivalent circuit diagram of the parasitic elements included in the interconnection pattern.

FIG. 12 illustrates a general way of computing the delay times for the interconnection N2. The interconnection between the output terminal "I1.x" and the input terminal "I2.a" includes the parasitic element K1, comprising the parasitic resistor RK1 and parasitic capacitor CK1, and the parasitic element K2, consisting of the parasitic resistor RK2 and parasitic capacitor CK2. The interconnection between the output terminal "I1.x" and the input terminal "I3.a" includes the parasitic element K1, the parasitic element K3, comprising the parasitic resistor RK3 and parasitic capacitor CK3, and the parasitic element K4, comprising the parasitic resistor RK4 and parasitic capacitor CK4. Cell input terminal capacitors CI2 and CI3 are respectively connected to the input terminals "I2.a" and "I3.a".

The delay time t1 between a pair of the output terminate "I1.x" and the input terminal "I2.a" is given by the following equation 1.

$$t1=(RK1/2*CK1)+(RK1*(CK3+CK4+CI3)) +((RK1+RK2/2)*CK2)+((RK1+RK2)+CI2) \quad (1)$$

The delay time t2 between a pair of the output terminal "I1.x" and the input terminal "I3.a" is given by the following equation 2.

$$t2=(RK1/2*CK1)+(RK1*(CK2+CI2)) +((RK1+RK3/2)*CK3)+ ((RK1+RK3+RK4)*CI4) +((RK1+RK3+RK4)*CI3) \quad (2)$$

As shown in FIG. 10, the acquired delay times t1 and t2 are stored in the delay time DT 25.

Next, to associate the parasitic element DT 24 and the delay time DT 25 with each other, the CPU 12 stores a storage address 28a in the delay time DT 25 in the parasitic element DT 24, and stores a storage address 28b in the parasitic element DT 24 in the delay time DT 25.

For example, the storage address 28a for the delay time t1 is stored in the individual areas 24c in the parasitic element DT 24 where the information on the parasitic elements K1 and K2 associated with the computation of the delay time t1 are respectively stored. Further, the storage address 28a for the delay time t1 is stored in the individual areas 24c where the information on the parasitic elements K1, K3 and K4 associated with the computation of the delay time t2 are respectively stored. The storage addresses 28b for the parasitic elements K1 and K3, the storage address 28b for the parasitic element K2 and the storage address 28b for the parasitic element K4 are stored in the individual areas 25a in the delay time DT 25 where the information on the delay times t1 and t2 are respectively stored.

Then, to associate the delay time DT 25 and the net DT 22 with each other, the CPU 12 stores a storage address 29a in the net DT 22 in the delay time DT 25, and stores a storage address 29b in the delay time DT 25 in the net DT 22.

For example, the delay time t1 is associated with a part of the interconnection N2 between the terminals "I1.x" and "I2.a". The delay time t2 is associated with a part of the interconnection N2 between the terminals "I1.x" and "I3.a". Therefore, the storage addresses for the delay times t1 and t2 are stored in the area 22a in the net DT 22 where the circuit connection information on the interconnection N2 is stored. The storage address 29a for the circuit connection information on the interconnection N2 is stored in the areas 25b in the delay time DT 25 where the information on the delay times t1 and t2 are stored.

Instead of the above-described process of collectively generating parasitic element information and delay time information based on the individual information in the net DT 22 and the pattern DT 23, the following process may be executed. When parasitic element information and delay time information have previously been prepared and stored in tie storage device 14, the CPU 12 may retrieve such information from the storage device 14 and may store it in the tables 24 and 25.

Process of Updating Circuit Pattern Information

When the operator has changed coordinate data of cells and/or a circuit pattern, the CPU 12 receives the altered coordinate data in step S13. The CPU 12 operates to renew the circuit pattern information in the pattern DT 23 using the received coordinate data.

The alteration of coordinate data is accomplished by using the CRT 15, the keyboard 16 and the mouse 17. The CPU 12 displays the layout of the semiconductor device 31 on the screen of the CRT 15 based on the circuit pattern information. While viewing the layout, the operator manipulates the keyboard 16 and the mouse 17 or otherwise instructs the alteration of the layout. In accordance with that instruction, the CPU 12 updates the coordinate data ta renew the circuit pattern information.

Figure 13:
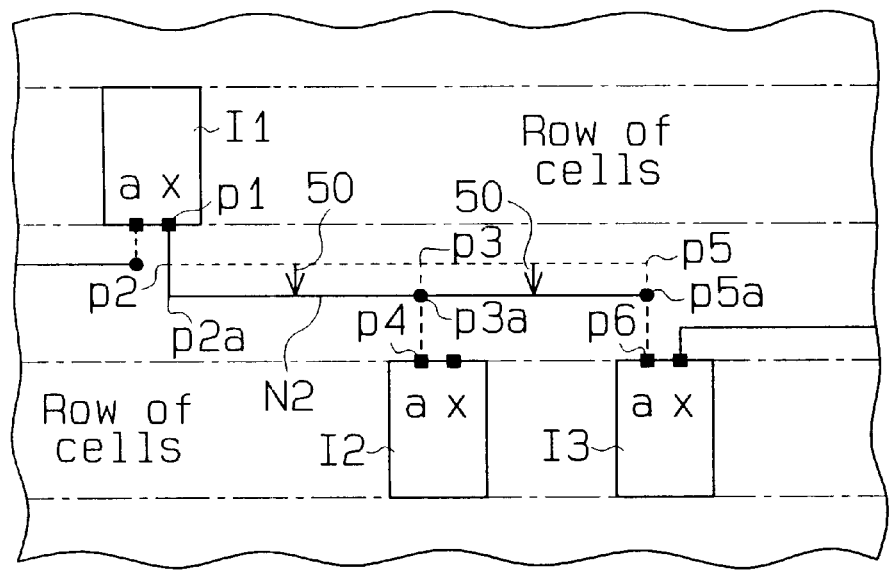
FIG. 13 shows the layout pattern of a logic circuit whose pattern has been altered.

Suppose that the operator has changed the layout to shift the interconnection N2 in the direction indicated by an arrow 50 as shown in FIG. 13. Then, the CPU 12 receives new coordinate data p2a, p3a and p5a of the interconnection N2, which have been generated due to the layout alteration.

Figure 16:
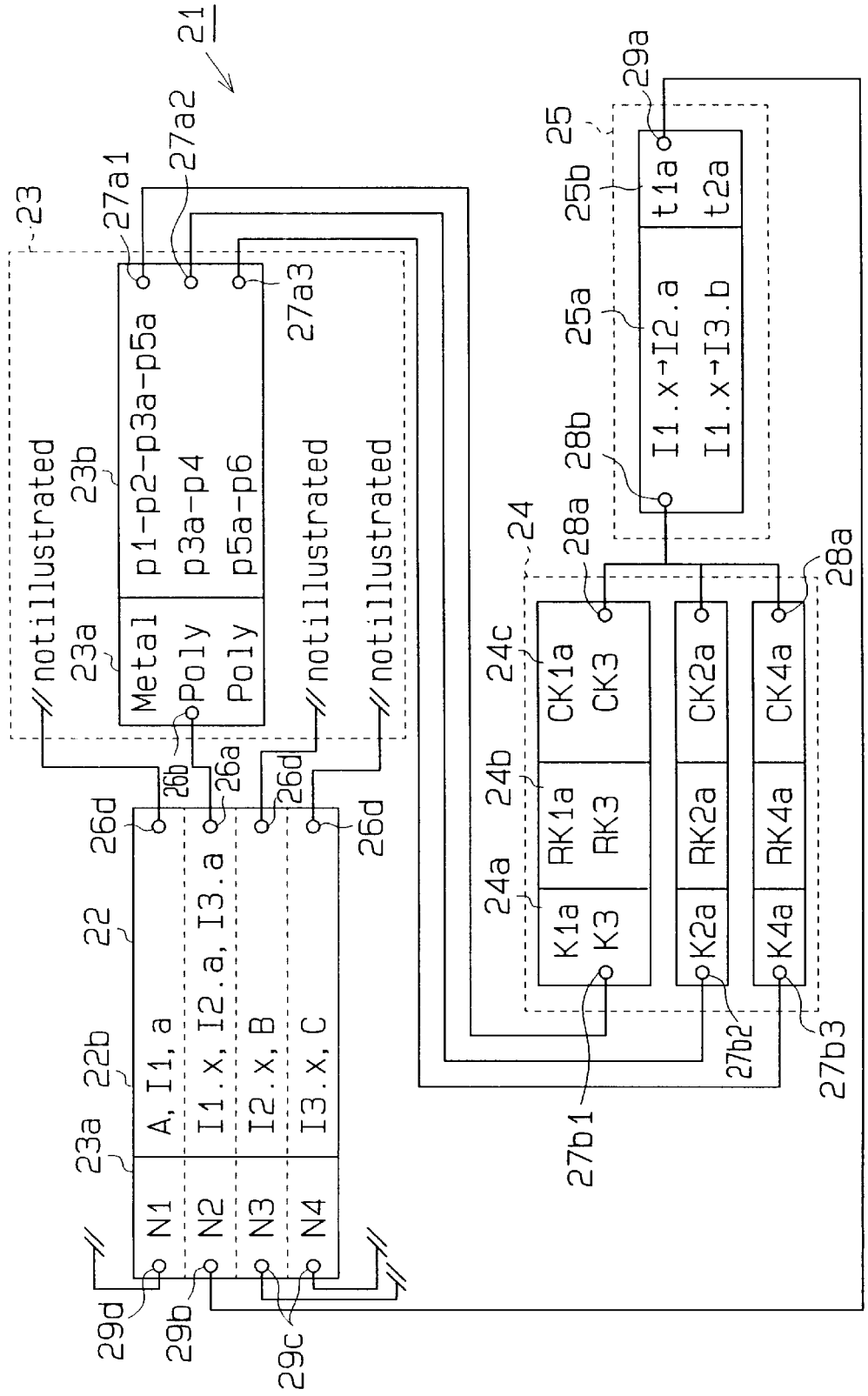
FIG. 16 illustrates the detailed structure of a database after the pattern alteration.

As shown in FIG. 16, the CPU 12 stores the new coordinate data p2a, p3a and p5a in the area 23b in the pattern DT 23 in accordance with the storage address 26a for the circuit pattern information of the interconnection N2 stored in the net DT 22. In other words, the circuit pattern among the coordinates p1, p2a, p3a and p5a, the circuit pattern between the coordinates p3a and p4 and the circuit pattern between the coordinates p5a and p6 are efficiently retrieved from the pattern DT 23 in accordance with the storage address 26a for the circuit pattern information of the interconnection N2. On the other hand, the information on the connection terminals "I1.x", "I2.a" and "I3.a" of the interconnection N2 can efficiently be retrieved from the net DT 22 by the storage address 26b of the circuit connection information stored in the pattern DT 23.

Process of Reextracting Parasitic Elements

In step S14, the CPU 12 reextracts parasitic elements based on the changed circuit pattern information, and renews the information on the associated parasitic elements stored in the parasitic element DT 24 with the information on the reextracted parasitic elements. As shown in FIG. 13, the lengths of the interconnection N2 among the coordinates p1, p2a and p3a, the coordinates p3a and p4 and the coordinates p5a and p6 after the alteration of the layout respectively differ from those before the alteration. Therefore, the resistances of the individual parasitic resistors and the capacitances of the individual parasitic capacitors among the coordinates p1, p2a and p3a, the coordinates p3a and p4 and the coordinates p5a and p6 after the alteration of the layout respectively differ from those before the alteration.

Figure 14:
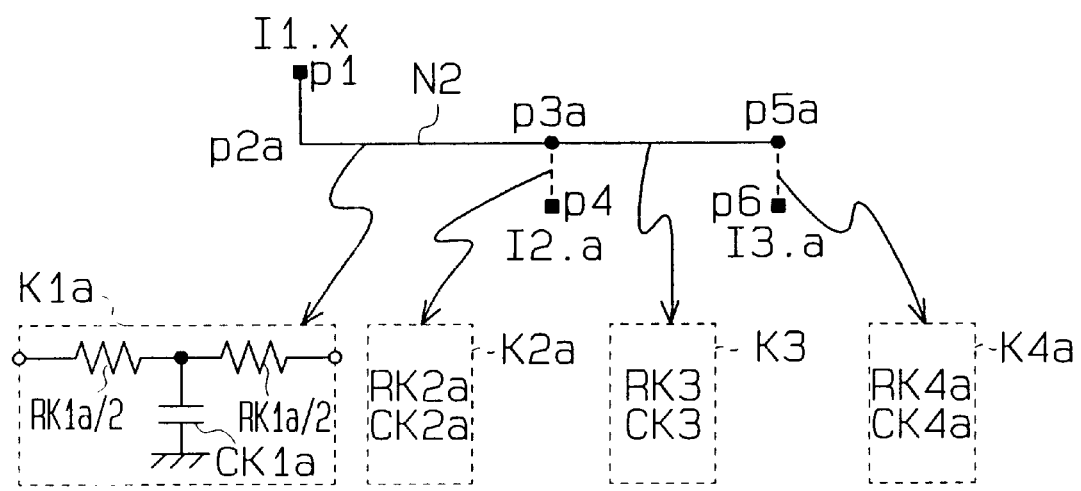
FIG. 14 is a diagram showing parasitic elements after the pattern alteration.

As shown in FIG. 14, the CPU 12 extracts a parasitic element K1a, which comprises of a parasitic resistor PK1a and a parasitic capacitor CK1a, associated with the circuit pattern among the coordinates p1, p2a and p3a. The CPU 12 extracts a parasitic element K2a, which comprises of a parasitic resistor RK2a and a parasitic capacitor CK2a, associated with the circuit pattern between the coordinates p3a and p4. Further, the CPU 12 extracts a parasitic element K4a, which comprises of a parasitic resistor RK4a and a parasitic capacitor CK4a, associated with the circuit pattern between the coordinates p5a and p6.

The interconnection length of the circuit pattern between the coordinates p3a and p5a, though shifted, is the same as that before the alteration. Therefore, the resistance of the parasitic resistor and the capacitance of the parasitic capacitor remain the same as those before the alteration. In this case, the parasitic element K3, comprising the parasitic resistor RK3 and the parasitic capacitor CK3 which have the same values as those before the layout change, are extracted for the interconnection between the coordinates p3a and p5a.

Next, the CPU 12 updates the parasitic element K1 in the area 24a in the parasitic element DT 24 with the parasitic element K1a in accordance with the storage address 27a1 for the parasitic element K1 (K3) stored in the pattern DT 23. Further, the parasitic resistor RK1 in the area 24b is updated with the parasitic resistor RK1a and the parasitic capacitor CK1 in the area 24c is updated with the parasitic capacitor CK1a. In other words, in accordance with the storage address 27a1 for the parasitic element K1 (K3) stored in the pattern DT 23, the information on the associated parasitic elements K1 and K3 can efficiently be retrieved from the parasitic element DT 24. Further, in accordance with the storage address 27b1 for the circuit pattern of the interconnection N2 stored in the parasitic element DT 24, the information on the circuit pattern among the associated coordinates p1, p2a and p3a can efficiently be retrieved from the pattern DT 23.

The CPU 12 updates the parasitic element K2 in the area 24a with the parasitic element K2a in accordance with the storage address 27a2 for the parasitic element K2 stored in the pattern DT 23. Further, the parasitic resistor RK2 in the area 24b is updated with the parasitic resistor RK2a and the parasitic capacitor CK2 in the area 24c is updated with the parasitic capacitor CK2a. In other words, in accordance with the storage address 27a2 for the parasitic element K2 stored in the pattern DT 23, the information on the associated parasitic element K2 can efficiently be retrieved from the parasitic element DT 24. Further, in accordance with the storage address 27b2 for the circuit pattern of the interconnection N2 stored in the parasitic element DT 24, the information on the circuit pattern between the associated coordinates p3a and p4 can efficiently be retrieved from the pattern DT 23.

Furthermore, the CPU 12 renews the parasitic element K3 in the area 24a with the parasitic element K3a in accordance with the storage address 27a3 for the parasitic element K3 stored in the pattern DT 23. Further, the parasitic resistor RK3 in the area 24b is renewed with the parasitic resistor RK3a and the parasitic capacitor CK3 in the area 24c is renewed with the parasitic capacitor CK3a. In other words, in accordance with the storage address 27a3 for the parasitic element K4 stored in the pattern DT 23, the information on the associated parasitic element K4 can efficiently be retrieved from the parasitic element DT 24. Further, in accordance with the storage address 27b3 for the circuit pattern of the interconnection N2 stored in the parasitic element ■ T 24, the information on the circuit pattern between the associated coordinates p5a and p6 can efficiently be retrieved from the pattern DT 23.

Process of Recomputing Delay Times

In the next step S15, the CPU 12 recomputes delay times between terminals using the updated parasitic element information and the equations 1 and 2, and updates new delay time information obtained through this recomputation with the delay time information stored in the delay time DT 25.

Figure 15:
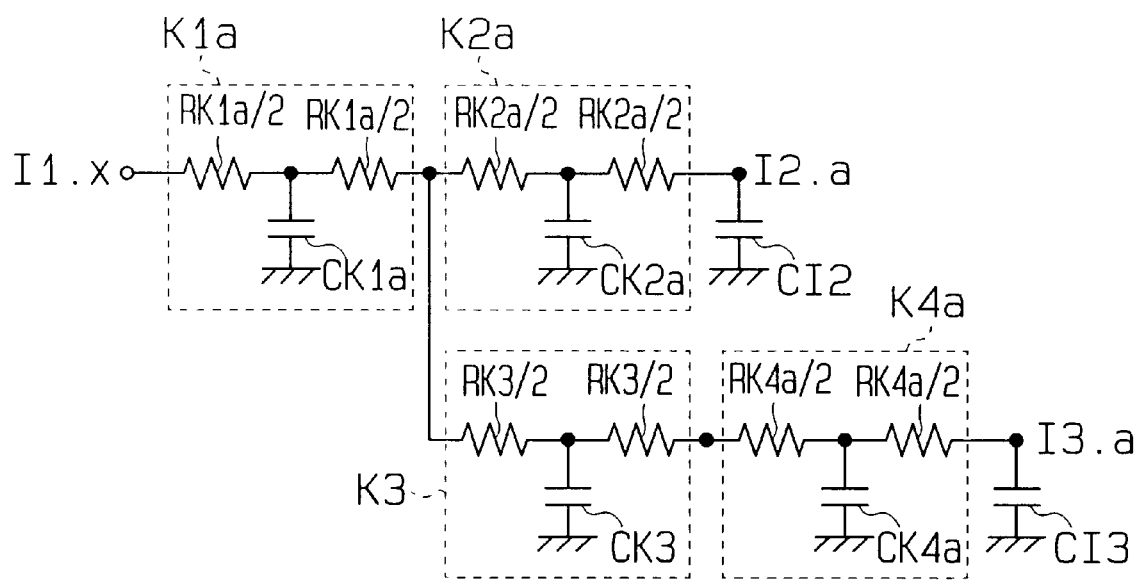
FIG. 15 is an equivalent circuit diagram of the parasitic elements after the pattern alteration.

New delay time t1a is computed based on the parasitic elements K1a and K2a associated with the interconnection between a pair of terminals "I1.x" and "I2.a" as shown in FIG. 15. In accordance with the storage address 28a for the delay time t1 stored in the parasitic element DT 24, the CPU 12 renews the delay time t1 in the area 25b in the delay time DT 25 with the delay time t1a. Further, a new delay time t2a is computed based on the parasitic elements K1a, K3 and K4a associated with the interconnection between a pair of terminals "I1.x" and "I3.a". In accordance with the storage address 28a for the delay time t2, the CPU 12 renews the delay time t2 in the area 25b with the delay time t2a.

In other words, in accordance with the storage address 28a for the delay times stored in the parasitic element DT 24, the associated delay times t1 and t2 can efficiently be retrieved from the delay time DT 25. In accordance with the storage address 28b for the parasitic elements stored in the delay time DT 25, on the other hand, the associated parasitic elements K1a, K2a, K3 and K4a can efficiently be retrieved from the parasitic element DT 24. Further, in accordance with the storage address 29a for the circuit connection information stored in the parasitic element DT 24, the circuit connection information of the associated interconnection N2 can efficiently be retrieved from the net DT 22. In accordance with the storage address 29b for the circuit connection information on the interconnection N2 stored in the net DT 22, on the other hand, the associated delay times t1 and t2 can efficiently be retrieved from the delay time DT 25.

In the next step S16, the CPU 12 determines if the operator has made further alteration of cells and the circuit pattern. When further alteration has been made, the CPU 12 repeats the processes in steps S13 to S15. When the alteration of the circuit pattern has been finished completely, the flow advances to step S17.

In step S17, the CPU 12 stores the delay time information, stored in the delay time DT 25, in a file (not shown) for the delay time data 4 (see FIG. 1), which has previously been defined in the storage device 14. The CPU 12 performs circuit simulation and inspects the circuit operations using the delay time data 4. The delay time data 4 may be supplied to the storage device 14 as needed in the loop of steps S13 to S16.

In the subsequent step S18, the CPU 12 supplies the circuit pattern information, stored in the pattern DT 23, as new layout data 2a (see FIG. 2) after alteration to the storage device 14. This new layout data 2a is used in mask generation or the like in the fabrication of the semiconductor device 31. The delay time associated with this new layout data 2a has already been computed. Unlike in the prior art, therefore, the extraction of parasitic elements and computation of delay times will not be performed by a batch process (collective process) after the layout design is completed. This shortens the design period for the semiconductor device 31. Data to be supplied to true storage device 14 is not limited to delay time data 4 and new layout data 2a after alteration, but may be circuit connection data and parasitic element data. In this case, a net list file associated with the parasitic elements can be output by exchanging the storage addresses for the net DT 22 and the parasitic element DT 24. Such a net list file permits the circuit simulation of an analog circuit.

A conventional layout apparatus, which stores information for associating circuit connection data 1 and layout data 2 with each other, has already been proposed. However, no association data between circuit patterns and parasitic element information, between parasitic element information and delay times, and between delay times and circuit connection information are stored in the database. Obviously, the conventional layout apparatus cannot efficiently retrieve parasitic element information from circuit pattern information, and delay time information from circuit connection information.

Second Embodiment

A layout design apparatus according to the second embodiment of this invention will now be described with reference to the accompanying drawings. To avoid the redundant description, like or same reference numerals are given to those components which are the same as the corresponding components of the first embodiment.

In the second embodiment, circuit connection data 1, layout data 2 and restriction data 5 (see FIG. 2) have been read from the storage device 14 and have been stored as program data in the memory 13 previously. The restriction data 5, which is generated by the CPU 12 based on the layout data 2, includes data representing an allowable delay time in association with a plurality of essential signal lines and data representing allowable lengths of those essential signal lines based on the delay time. This program data is used for the correction of the layout data 2 which is executed by comparing the delay time of the changed circuit pattern with the delay time of the restriction data 5. The circuit connection data 1 and the restriction data 5 are generated by the circuit designing process (step S6) shown in FIG. 2. The layout data 2 is generated by the automatic interconnection process (step S8) and is stored in the storage device 14. The data 1, 2 and 5 are transferred together with the program data to the memory 13 from the storage device 14 at the time the program is executed.

Figure 18:
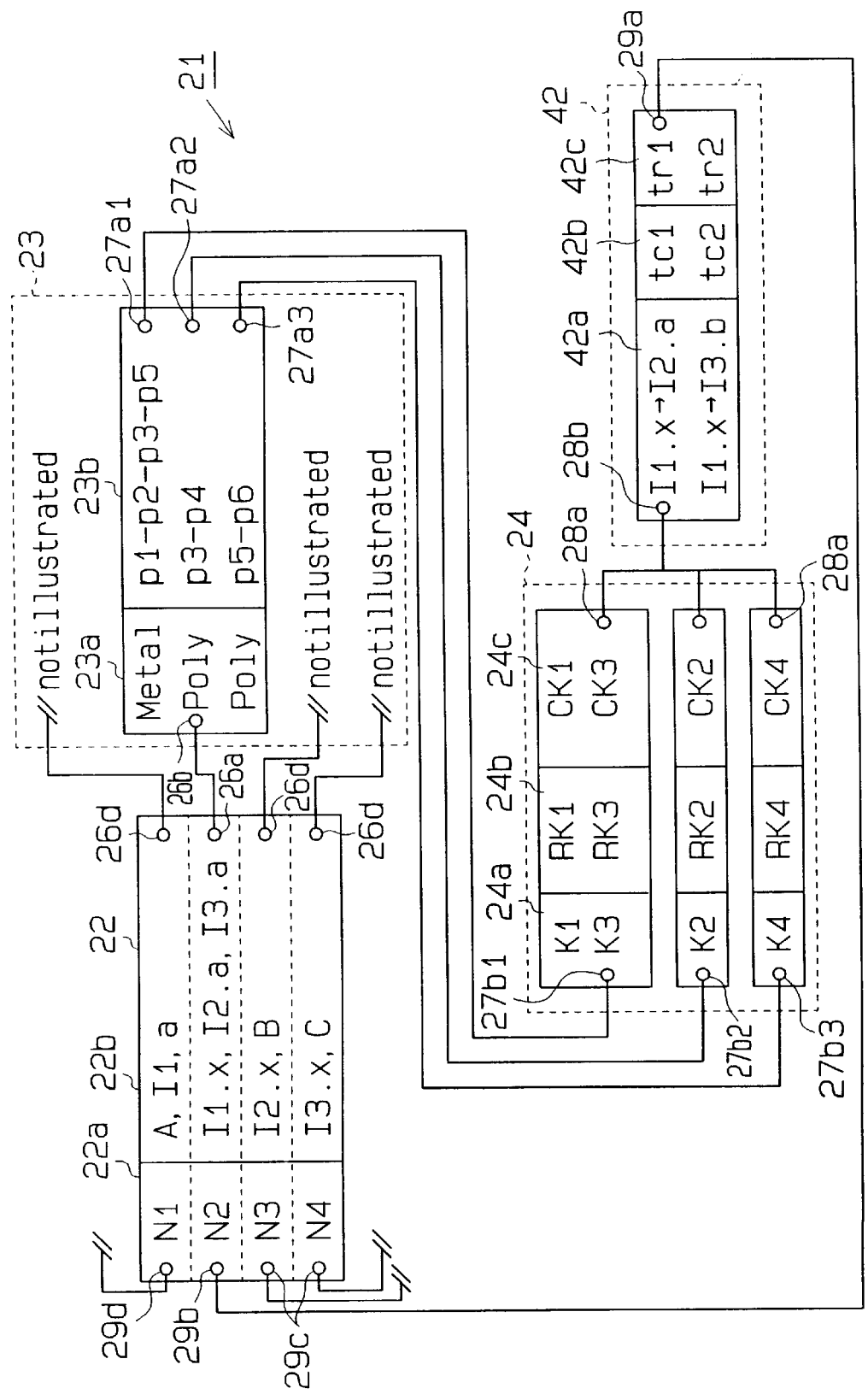
FIG. 18 illustrates the detailed structure of a database generated by the layout process according to the second embodiment of the present invention.

As shown in FIG. 18, a delay time DT 42 in a database 41 includes an area 42a for storing inter-terminal information, an area 42b for storing allowable delay time (or constant delay time) included in the restriction data 5 and an area 42c for storing a recomputed actual delay time.

Figure 17:
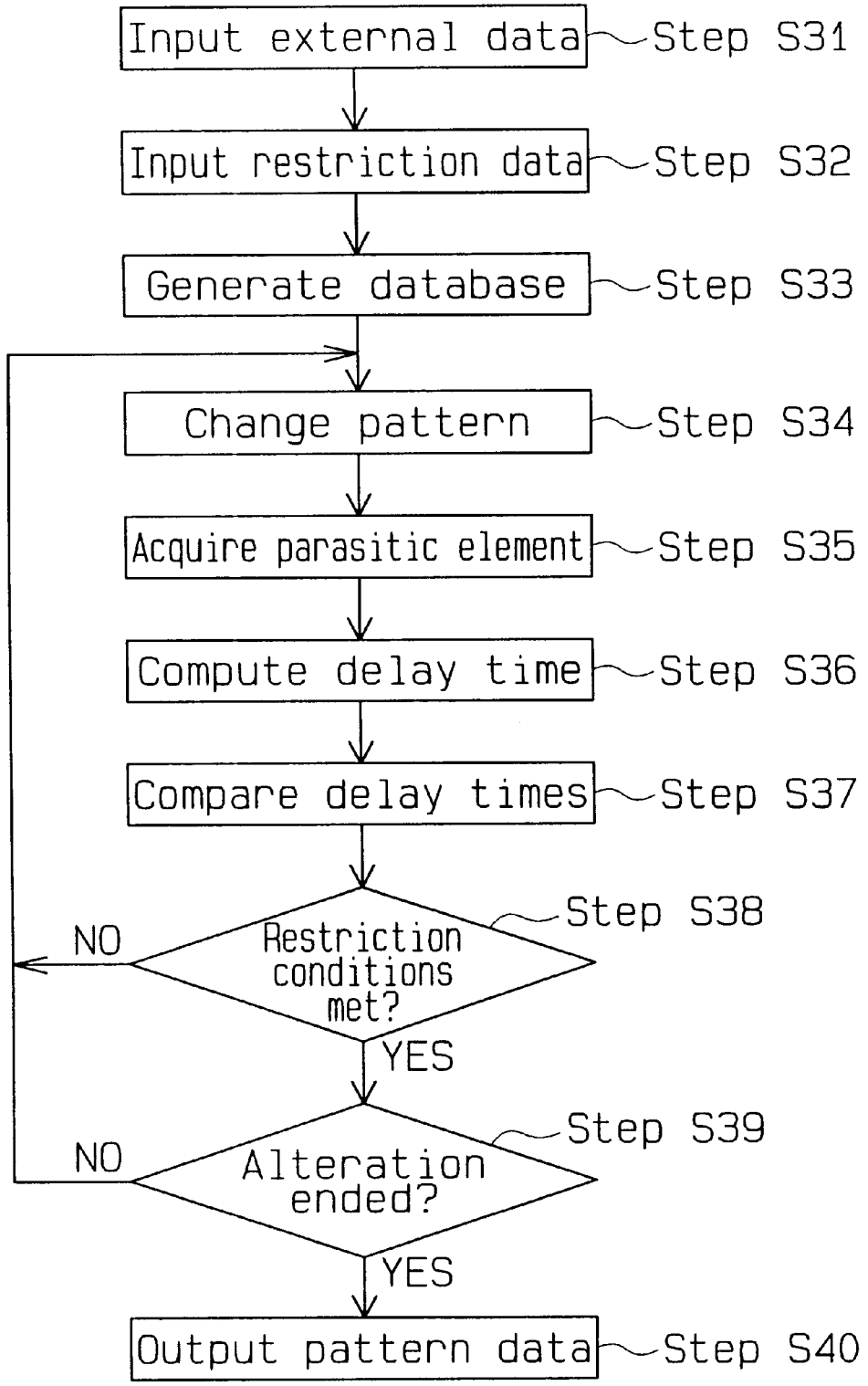
FIG. 17 is a flowchart illustrating a layout process according to a second embodiment of the present invention.

As shown in FIG. 17, the CPU 12 receives circuit connection data 1 and layout data 2 from the memory 13, and stores circuit connection information in the net DT 22 and circuit pattern information in the pattern DT 23 in step S31.

In the subsequent step S32, the CPU 12 receives restriction data 5 from the memory 13 and stores allowable delay times tc1 and tc2 included in the restriction data 5 in an area 42b in the delay time DT 42.

In the next step S33, the CPU 12 generates parasitic element information and delay time information using the circuit connection information stored in the net DT 22 and the circuit pattern information stored in the pattern DT 23. The parasitic element information is stored in the parasitic element DT 24 and the delay time information in the delay time DT 25. Specifically, actual delay times tr1 and tr2 included in the delay time information are stored in an area 42c in the delay time DT 25.

When the layout of the cells and/or the position of a circuit pattern is changed by the operator, the CPU 12 recalculates the circuit pattern information in the pattern DT 23 in step S34.

In step S35, the CPU 12 reextracts parasitic elements from the new circuit pattern information and updates the parasitic element information in the parasitic element DT 24.

In step S36, the CPU recomputes the delay time using the reacquired parasitic element information to renew the delay time information in the delay time DT 42. Actual delay times tr1 and tr2 stored in the area 42C shown in FIG. 18 indicates a new delay time after updating.

In step S37, the CPU 12 compares the allowable delay times tc1 and tc2 stored in the area 42b in the delay time DT 25 with the actual delay times tr1 and tr2 stored in the area 42c.

Based on the comparison result, the CPU 12 determines if the changed layout of the cells and/or the circuit pattern satisfies the conditions of the restriction data 5 in step S38.

When the actual delay times tr1 and tr2 substantially match with the associated allowable delay times tc1 and tc2, it is determined that the changed layout satisfies the conditions of the restriction data 5 and the flow advances to step S39. Instead of this determination condition, the changed layout may be determined to satisfy the conditions of the restriction data 5 when the actual delay times tr1 and tr2 lie within a predetermined allowable range.

In step S39, it is determined if the operator has made further alteration on the coordinate data of the cells and the circuit pattern. Until the pattern change is completely finished, therefore, the sequence of processes in steps S34 to S38 is repeated.

When the real delay times tr1 and tr2 do not match with the respective allowable delay times tc1 and tc2 or do not lie in the predetermined allowable range, it is determined in step S33 that the changed layout does not meet the conditions of the restriction data 5. In this case, the CPU 12 displays on the screen of the CRT 15 something indicating an error in the layout alteration. Thereafter, the flow goes to step S13 from step S33 to request the operator to change the layout again. In this manner, the operator changes the layout in such a way that the cell/circuit pattern layout meets the conditions of the restriction data 5. Accordingly, any alteration of the layout which does lot fulfill the conditions of the restriction data 5 is inhibited. It is also possible to determine, before the processing of the circuit/logic simulator, if the conditions of the restriction data 5 are met. This can allow the design period to be shortened while satisfying the conditions of the restriction data.

Although several embodiments of the present invention have been described herein, it should be apparent to those skilled in the art that the present invention may be embodied in many other specific forms without departing from the spirit or scope of the invention. Particularly, it should be understood that the invention may be embodied in the following forms.

This invention may be adapted to designing a semiconductor circuit device which uses logic circuits, such as an AND gate and OR gate, instead of the aforementioned inverter having the input terminal a and the output terminal x.

Therefore, the present examples and embodiments are to be considered as illustrative and not restrictive and the invention is not to be limited to the details given herein, but may be modified within the scope and equivalence of the appended claims.

What is claimed is:

1. A method of a computer aided design system of performing a layout process of an integrated circuit using predetermined logic design and predetermined connection data, said connection data being changeable by an operator, said method comprising the steps of:
   (a) providing a database comprising a data structure the data structure including:
      a net data table comprising connection data,
      a pattern data table,
      a parasitic element data table comprising parasitic element data,
      a delay time data table comprising signal delay times,
      first association data associating the net data table with the pattern data table,
      second association data associating the pattern data table with the parasitic element data table, and
      third association data associating the parasitic element data table with the delay time data table;
   (b) generating layout data using the connection data;
   (c) storing the layout data in the pattern data table;
   (d) extracting parasitic elements from the layout data to generate the parasitic element data;
   (e) storing the parasitic element data in the parasitic element data table;
   (f) computing signal delay times of the parasitic elements to generate delay time data;
   (g) storing the computed delay time data in the delay time data table;
   (h) generating new layout data using new connection data when said connection data is changed by said operator;
   (i) replacing the layout data stored in the pattern data table with said new layout data;
   (j) extracting parasitic elements from the new layout data to generate new parasitic element data;
   (k) replacing the parasitic element data stored in the parasitic element data table with said new parasitic element data;
   (l) computing signal delay times of the new parasitic elements to generate new delay time data;
   (m) replacing the delay time data stored in the delay time data table with said new delay time data;
   (n) repeating steps (h) through (m) each time the connection data is changed by said operator;
   (o) comparing the signal delay times to respective predetermined boundary values of the connection data;
   (p) interactively correcting the layout data if any critical nets are outside of their respective bounds;
   (q) updating the layout data stored in the pattern data table with the updated layout data; and
   (r) repeating steps (h) through (q) until no signal delay times are outside of their respective predetermined boundary values.

2. A method of a computer aided design system of performing a layout process of an integrated circuit using predetermined logic design and predetermined connection data, said connection data being changeable by an operator, said method comprising the steps of:
   (a) providing a database comprising a data structure, the data structure including:
      a net data table comprising connection data,
      a pattern data table,
      a parasitic element data table comprising parasitic element data, a delay time data table comprising signal delay times,
first association data associating the net data table with the pattern data table,
second association data associating the pattern data table with the parasitic element data table, and
third association data associating the parasitic element data table with the delay time data table;

(b) generating layout data using the connection data;

(c) storing the layout data in the pattern data table;

(d) extracting parasitic elements from the layout data to generate the parasitic element data;

(e) storing the parasitic element data in the parasitic element data table;

(f) computing signal delay times of the parasitic elements to generate delay time data;

(g) storing the computed delay time data in the delay time data table;

(h) generating new layout data using new connection data when said connection data is changed by said operator;

(i) replacing the layout data stored in the pattern data table with said new layout data;

(j) extracting parasitic elements from the new layout data to generate new parasitic element data;

(k) replacing the parasitic element data stored in the parasitic element data table with said new parasitic element data;

(l) computing signal delay times of the new parasitic elements to generate new delay time data;

(m) replacing the delay time data stored in the delay time data table with said new delay time data;

(n) repeating steps (h) through (m) each time the connection data is changed by said operator;

(o) comparing the signal delay times to respective predetermined boundary values of the connection data;

(p) interactively correcting the layout data if any critical nets are outside of their respective bounds;

(q) updating the layout data stored in the pattern data table with the updated layout data; and (r) repeating steps (h) through (q) until no signal delay times are outside of their respective predetermined boundary values, wherein the data structure includes fourth association data, the method further comprising the step of linking the delay time data and its associated connection data with the fourth association data, and wherein said step (o) includes the step of comparing the signal delay times in the delay time data table to respective predetermined boundary values of the connection data in accordance with the fourth association data.

3. An apparatus for designing a layout of an integrated circuit using predetermined logic design and predetermined connection data, said connection data being changeable by an operator, said apparatus comprising:

an input device operable by the operator to input and change said connection data;

a memory including a database comprising a predetermined data structure, the data structure including,
a net data table comprising connection data,
a pattern data table,
a parasitic element data table comprising parasitic element data,
a delay time data table comprising signal delay times,
first association data associating the net data table with the pattern data table,
second association data associating pattern data table with the parasitic element data table, and
third association data associating the parasitic element data table with the delay time data table; and a processing unit, coupled to said input unit and said memory, operating to:
(a) generate layout data using the connection data;
(b) store the layout data in the pattern data table;
(c) extract parasitic elements from the layout data to generate the parasitic element data;
(d) store the parasitic element data in the parasitic element data table,
(e) compute signal delay times of the parasitic elements to generate delay time data;
(f) store the computed delay time data in the delay time data table;
(g) generate new layout data using new connection data when said connection data is changed by said operator using said input device;
(h) replace the layout data stored in the pattern data table with said new layout data;
(i) extract parasitic elements from the new layout data to generate new parasitic element data;
(j) replace the parasitic element data stored in the parasitic element data table with said new parasitic element data;
(k) compute signal delay times of the new parasitic elements to generate new delay time data;
(l) replace the delay time data stored in the delay time data table with said new delay time data;
(m) repeat said operations (g) through (l) each time said connection data is changed by said operator;
(n) compare the signal delay times to respective predetermined boundary values of the connection data;
(o) interactively correct the layout data if any of critical nets are outside of their respective bounds;
(p) update the layout data stored in the pattern data table with the updated layout data; and
(q) repeat said operations (g) through (p) until no signal delay times are outside of their respective predetermined boundary values.

4. An apparatus for designing a layout of an integrated circuit using predetermined logic design and predetermined connection data, said connection data being changeable by an operator, said apparatus comprising:

an input device operable by the operator to input and change said connection data;

a memory including a database comprising a predetermined data structure, the data structure including,
a net data table comprising connection data,
a pattern data table,
a parasitic element data table comprising parasitic element data,
a delay time data table comprising signal delay times,
first association data associating the net data table with the pattern data table,
second association data associating pattern data table with the parasitic element data table, and
third association data associating the parasitic element data table with the delay time data table; and a processing unit, coupled to said input unit and said memory, operating to:
(a) generate layout data using the connection data;
(b) store the layout data in the pattern data table;

(c) extract parasitic elements from the layout data to generate the parasitic element data;
(d store the parasitic element data in the parasitic element data table,
(e) compute signal delay times of the parasitic elements to generate delay time data;
(f) store the computed delay time data in the delay time data table;
(i) generate new layout data using new connection data when said connection data is changed by said operator using said input device;
(h) replace the layout data stored in the pattern data table with said new layout data;
(i) extract parasitic elements from the new layout data to generate new parasitic element data;
(j) replace the parasitic element data stored in the parasitic element data table with said new parasitic element data;
(k) compute signal delay times of the new parasitic elements to generate new delay time data;
(l) replace the delay time data stored in the delay time data table with said new delay time data;
(m) repeat said operations (g) through (l) each time said connection data is changed by said operator;
(n) compare the signal delay times to respective predetermined boundary values of the connection data;
(o) interactively correct the layout data if any of critical nets are outside of their respective bounds;
(p) update the layout data stored in the pattern data table with the updated layout data; and
(q) repeat said operations (g) through (p) until no signal delay times are outside of their respective predetermined boundary values, wherein the data structure includes fourth association data, and said processing unit further operates to link the delay time data and its associated connection data with the fourth association data and compare the signal delay times in the delay time data table to respective predetermined boundary values of the connection data in accordance with the fourth association data in said operation (n).

* * * * *

UNITED STATES PATENT AND TRADEMARK OFFICE
CERTIFICATE OF CORRECTION

PATENT NO.:   6,099,581
DATED     :   August 8, 2000
INVENTOR(S):  Sakai

It is certified that errors appear in the above-identified patent and that said Letters Patent is hereby corrected as shown below:

On the title page, item:

[56]  please correct the "class/unit" references as follows:
    after "4,823,278"  change "716/6" to --364/491--;
    after "5,353,235"  change "716/14" to --364/491--;
    after "5,461,576"  change "716/6" to --364/490--;
    after "5,581,474"  change "716/2" to --364/490--;
    after "5,629,860"  change "716/6" to --364/490--;
    after "5,636,132"  change "716/2" to --364/491--;
    after "5,638,294"  change "716/5" to --364/491--;
    after "5,654,898"  change "716/9" to --364/490--;
    after "5,689,432"  change "716/18" to --364/490--;
    after "5,724,250"  change "716/3" to --364/488--; and
    after "5,903,469"  change "716/5" to --364/489--.

[57]  ABSTRACT
    line 13, delete ";"; and
    line 14, delete ";".

UNITED STATES PATENT AND TRADEMARK OFFICE
CERTIFICATE OF CORRECTION

PATENT NO. : 6,099,581
DATED : August 8, 2000
INVENTOR(S) : Sakai

It is certified that error appears in the above-identified patent and that said Letters Patent is hereby corrected as shown below:

Column 16,
    line 7, after "structure" insert --,--.

Signed and Sealed this

Twenty-second Day of May, 2001

Attest:

NICHOLAS P. GODICI

*Attesting Officer*      Acting Director of the United States Patent and Trademark Office